(12) United States Patent
Bioglio et al.

(10) Patent No.: US 11,245,424 B2
(45) Date of Patent: Feb. 8, 2022

(54) DEVICE AND METHOD FOR GENERATING A MULTI-KERNEL POLAR CODE

(71) Applicant: Huawei Technologies Co., Ltd., Shenzhen (CN)

(72) Inventors: Valerio Bioglio, Boulogne Billancourt (FR); Ingmar Land, Boulogne Billancourt (FR)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/797,214

(22) Filed: Feb. 21, 2020

(65) Prior Publication Data

US 2020/0195279 A1 Jun. 18, 2020

Related U.S. Application Data

(63) Continuation of application No. PCT/EP2017/071185, filed on Aug. 23, 2017.

(51) Int. Cl.
*H03M 13/00* (2006.01)
*H03M 13/13* (2006.01)
(Continued)

(52) U.S. Cl.
CPC .......... *H03M 13/616* (2013.01); *G06F 17/16* (2013.01); *H03M 13/033* (2013.01);
(Continued)

(58) Field of Classification Search
CPC ...... H03M 13/616; H03M 13/13; G06F 17/16
See application file for complete search history.

(56) References Cited

U.S. PATENT DOCUMENTS

| 6,553,516 B1 | 4/2003 | Suda et al. |
| 2007/0083803 A1 | 4/2007 | Chen et al. |

(Continued)

FOREIGN PATENT DOCUMENTS

| CN | 1274202 A | 11/2000 |
| CN | 101326728 A | 12/2008 |

(Continued)

OTHER PUBLICATIONS

Vangala, H., et al. "A Comparative Study of Polar Code Constructions for the AWGN Channel," arXiv:1501.02473v1 [cs.IT], Jan. 11, 2015, 9 pages.

(Continued)

*Primary Examiner* — Joseph D Torres
(74) *Attorney, Agent, or Firm* — Conley Rose, P.C.

(57) ABSTRACT

A device for generating a multi-kernel polar code $x_N$ of length N and dimension K on the basis of a first transformation matrix $G_N$ of size N×N that defines a first multi-kernel polar code includes a processor configured to generate a second transformation matrix $G'_N$ of size N×N by permuting the order of at least two columns of a sub-matrix of the first transformation matrix $G_N$, and generate the multi-kernel polar code $x_N$ an the basis of $x_N = u_N \cdot G'_N$, wherein $u_N = (u_0, \ldots, u_{N-1})$ is a vector of size N, with the elements $u_i$, i=0, ... N−1, corresponding to an information bit if i∈I, I being a set of K information bit indices, and $u_i$=0, if i∈F, F being a set of N−K frozen bit indices.

20 Claims, 9 Drawing Sheets

(51) Int. Cl.
*G06F 17/16* (2006.01)
*H03M 13/03* (2006.01)
*H03M 13/11* (2006.01)
*H03M 13/15* (2006.01)

(52) U.S. Cl.
CPC ....... *H03M 13/1168* (2013.01); *H03M 13/13* (2013.01); *H03M 13/1505* (2013.01)

(56) References Cited

U.S. PATENT DOCUMENTS

| | | | |
|---|---|---|---|
| 2014/0169492 | A1 | 6/2014 | Mahdavifar et al. |
| 2015/0194987 | A1 | 7/2015 | Li et al. |
| 2015/0333769 | A1* | 11/2015 | Jeong ................. H03M 13/271 714/790 |
| 2016/0241258 | A1 | 8/2016 | Zeng et al. |
| 2016/0285479 | A1* | 9/2016 | El-Khamy .......... H03M 13/616 |
| 2017/0222757 | A1 | 8/2017 | Huang et al. |

FOREIGN PATENT DOCUMENTS

| | | |
|---|---|---|
| CN | 103414540 A | 11/2013 |
| CN | 105340183 A | 2/2016 |
| CN | 106899311 A | 6/2017 |
| CN | 106998208 A | 8/2017 |
| CN | 107040261 A | 8/2017 |
| WO | 2018033206 A1 | 2/2018 |
| WO | 2018113994 A1 | 6/2018 |

OTHER PUBLICATIONS

Arikan, E., "Channel Polarization: A Method for Constructing Capacity-Achieving Codes for Symmetric Binary-Input Memoryless Channels," IEEE Transactions on Information Theory, vol. 55, No. 7, Jul. 2009, pp. 3051-3073.
Tal, I., et al., "List Decoding of Polar Codes," IEEE International Symposium on Information Theory Proceedings, Jul. 2011, 5 pages.
Golay, M., "Notes on digital coding," Proceedings of the Institute of Radio Engineers, vol. 37, p. 657, Jun. 1949, 1 page.
Buzaglo, S., et al., "Permuted Successive Cancellation Decoding for Polar Codes," in IEEE ISIT, XP032702067, Jun. 2017, pp. 2623-2627.
Gabry, F., et al., "Multi-Kernel Construction of Polar Codes," XP033111558, IEEE International Conference on Communications Workshops (ICC Workshops), May 21, 2017, p. 761-765.
Vangala, H., et al., "Permuted Successive Cancellation Decoder for Polar Codes," XP032702067, International Symposium on Information Theory and Its Applications, IEICE, Oct. 26, 2014, pp. 438-442.
Presman, et al. "Mixed-Kernels Constructions of Polar Codes," XP011593898, IEEE Journal on Selected Areas in Communications, vol. 34, No. 2, Feb. 2016, p. 239-253.

\* cited by examiner

DEVICE AND METHOD FOR GENERATING A MULTI-KERNEL POLAR CODE

CROSS-REFERENCE TO RELATED APPLICATIONS

This application is a continuation application of International Patent Application No. PCT/EP2017/071185, filed on Aug. 23, 2017. The disclosure of the aforementioned application is hereby incorporated by reference in its entirety.

TECHNICAL FIELD

In general, the disclosure relates to data encoding and decoding in communication systems. More specifically, the disclosure relates to a device and method for encoding and decoding data using multi-kernel polar codes.

BACKGROUND

Reliable transmission of data over noisy communication channels requires some kind of error correction coding to be used. Polar codes are a class of channel codes introduced by Arikan in the work "Channel polarization: a method for constructing capacity-achieving codes for symmetric binary-input memoryless channels," IEEE Trans. Inf. Theo, July 2009. They are provably capacity-achieving over various classes of channels, and they provide excellent error rate performance for practical code lengths.

In their original construction according to the aforementioned work by Arikan, polar codes are based on the polarization effect of the Kronecker products of the matrix:

$$T_2 = \begin{pmatrix} 1 & 0 \\ 1 & 1 \end{pmatrix}.$$

This matrix is also called kernel of the polar code. A polar code of length N and dimension K is defined by a transformation matrix $G_N = T_2^{\otimes n}$, $N=2^n$, and a frozen set $F \subset [N]$, $[N]=\{0,1,\ldots,N-1\}$, of size $|F|=N-K$. The information set is the complementary set of the frozen set. $I=[N]\backslash F$, of size $|I|=K$. For encoding, the elements $u_i$ of a binary input vector $u_N$ of length N are set to zero for $i \in F$, and to the information bits for $i \in I$. The polar code is obtained as $x_N = u_N \cdot G_N$. In particular, the relationship between the input vector $u_N$ and the codeword $x_N$ can be represented by a Tanner graph, which has a number of stages or layers equal to n. Moreover, the Tanner graph is the basis for the decoding algorithms.

As it follows from the above description, any code dimension (i.e., number of information bits) K of polar codes is possible. Thus, polar codes admit any code rate R=K/N. However, a drawback of the original construction of polar codes is that their code lengths are restricted to powers of 2, i.e., $N=2^n$. This is not sufficient in order to cover the diversity of block lengths demanded by modern communication systems.

Other approaches have been suggested to solve the problem related to the length of polar codes, as elucidated in the following.

To tackle the code length problem of the original construction of polar codes, a multi-kernel construction of polar codes has been proposed in PCT/EP2016/069593. Using kernels of different dimensions in the various layers of the Tanner graph, polar codes of block lengths that are not only powers of two can be constructed. This results in a multi-kernel polar code with a very good performance, while the encoding complexity remains low and the decoding follows the same general structure as for usual polar codes obtained from kernels $T_2$ only. The multi-kernel construction largely increases the number of code lengths that can be achieved without puncturing or shortening. It is worth noticing that the original polar codes are a sub-case of multi-kernel polar codes, wherein the block length is a power of 2. In fact, if the kernels forming the transformation matrix of the multi-kernel polar code are of the form $T_2 \otimes \ldots \otimes T_2$, the multi-kernel polar code is actually a polar code.

The main idea of the polar codes is that, based on successive-cancellation (SC) decoding as will be elucidated below, some input bit positions are more reliable than others due to a polarization phenomenon. This holds for multi-kernel polar codes as well, wherein the information bits are put in the most reliable positions of the input vector $u_N$, while the unreliable positions of the input vector are set to the fixed bit value 0, called also frozen bits, which form the frozen set, as described above. The reliabilities of the input bit positions can be obtained by density evolution, genie-aided simulation, or oilier similar methods (see, e.g., "A comparative study of polar code constructions for the AWGN channel," arXiv:1501.02473, 2015, by H. Vangala et al.).

Another important parameter of a linear code, in particular of a polar code, is the minimum distance and it largely determines the slope of the error-rate curve. Polar codes permit only to achieve a limited range of minimum distances. In particular, the minimum distance of a polar code is a power of two, and it is the smallest Hamming weight of row's of the transformation matrix indexed by the information set. This is a significant limit for the design of polar codes, particularly for short lengths where the minimum distance plays a crucial role. In particular, in this range, polar codes show a poor performance compared to other block codes. Multi-kernel polar codes can increase the range of minimum distances. However, the structure of the codes, which is based on Kronecker products of kernel matrices, does not allow the code to reach the maximal minimum distance for a given code length and dimension.

In other approaches, different approaches have been suggested in order to improve polar codes by permuting decoding elements, as elucidated in the following.

In the work by H. Vangala et al., "Permuted successive cancellation decoder for polar codes", in IEEE ISITA, October 2014, it is suggested to permute the stages of the SC decoder Tanner graph. This does not change the transformation matrix of the code, since the encoder is not affected by this change. Moreover, the resulting permuted SC decoder matches the results of the classic SC decoder.

In the work by S. Buzaglo et al., "Permuted successive cancellation decoding for polar codes", in IEEE ISIT, June 2017, a permutation on the input vector has been proposed for the decoding of large kernels.

The effect of this permutation is to shuffle the rows of the transformation matrix, thereby altering the bit reliabilities, and changing the bit decoding order. However, as a consequence, the SC decoder has to be modified, which increases the decoding complexity.

Thus, there is a need for an improved device and method for encoding and decoding data using multi-kernel polar codes.

SUMMARY

It is an object of the disclosure to provide for an improved device and method for encoding and decoding data using multi-kernel polar codes.

The foregoing and other objects are achieved by the subject matter of the independent claims. Further implementation forms are apparent from the dependent claims, the description and the figures.

According to a first aspect, the disclosure relates to a device for generating a multi-kernel polar code $x_N$ of length N and dimension K on the basis of a first transformation matrix $G_N$ of size N×N defining a first multi-kernel polar code. The device comprises a processor configured to generate a second transformation matrix $G'_N$ of size N×N by permuting the order of at least two columns of a sub-matrix of the first transformation matrix $G_N$, and generate the multi-kernel polar code $x_N$ on the basis of the following equation:

$$x_N = u_N \cdot G'_N,$$

wherein $u_N = (u_0, \ldots, u_{N-1})$ is a vector of size N, with the elements $u_i$, $i=0, \ldots N-1$, corresponding to an information bit if $i \in I$, I being a set of K information bit indices, and $u_i = 0$, if $i \in F$, F being a set of N−K frozen bit indices.

Thus, an improved device is provided, since the generated multi-kernel polar code can be decoded according to the usual SC decoding (or SC list decoding) operations, the reliabilities of the input bits are not altered, and the decoding order of the input bits is maintained. Thus, the added permutation does not change the structure and the complexity of the SC (list) decoder. Moreover, the device can generate the multi-kernel polar code in a flexible way by means of a permutation improving the distance spectrum of the multi-kernel polar code. Moreover, the device allows to generate a multi-kernel polar code leading to lower error rates compared to other approaches, i.e., having a better performance, and reducing the cyclic redundancy check (CRC) size in SC list decoding.

In a possible implementation form of the device according to the first aspect, the processor is configured to permute the order of at least two columns of a sub-matrix of the first transformation matrix $G_N$ such that the second transformation matrix $G'_N$ has the same polarization as the first transformation matrix $G_N$.

This provides the advantage of obtaining a multi-kernel polar code having improved minimum distance properties and, at the same time, having polarization properties which improve the reliability transmission of data over noisy communication channels.

In another possible implementation form of the device according to the first aspect, the processor is configured to generate the second transformation matrix $G'_N$ of size N×N by permuting the order of the least two columns of the sub-matrix of the first transformation matrix $G_N$ and by permuting the order of at least two columns of a further sub-matrix of the first transformation matrix $G_N$.

This provides the advantage of obtaining a multi-kernel polar code having improved minimum distance and polarization properties in an easy and efficient way by performing a permutation operation.

In another possible implementation form of the device according to the first aspect, the processor is configured to generate the first transformation matrix $G_N$ on the basis of the following equation:

$$G_N = T_{N_b} \otimes T_{N_a} = \begin{pmatrix} b_{1,1}T_{N_a} & \cdots & b_{1,N_b}T_{N_a} \\ \vdots & \ddots & \vdots \\ b_{N_b,1}T_{N_a} & \cdots & b_{N_b,N_b}T_{N_a} \end{pmatrix},$$

$$T_{N_b} = \begin{pmatrix} b_{1,1} & \cdots & b_{1,N_b} \\ \vdots & \ddots & \vdots \\ b_{N_b,1} & \cdots & b_{N_b,N_b} \end{pmatrix},$$

wherein $T_{N_b} = T_{p_1} \otimes \ldots \otimes T_{p_\lambda}$ is a first kernel matrix of dimension $N_b \times N_b$, $N_b = p_1 \cdot \ldots \cdot p_\lambda$, and $T_{N_a} = T_{p_{\lambda+1}} \otimes \ldots \otimes T_{p_s}$ is a second kernel matrix of dimension $N_a \times N_a$, $N_a = p_{\lambda+1} \cdot \ldots \cdot p_s$, and wherein $T_{p_j}$ is a kernel matrix of dimension $p_j \times p_j$, and wherein $\lambda$ is an integer assuming a value in the interval $[0, \ldots, s]$, s being the total number of kernel matrices $T_{p_j}$ forming the first kernel matrix $T_{N_b}$ and the second kernel matrix $T_{N_a}$, and wherein the processor is further configured to generate the second transformation matrix $G'_N$ on the basis of the following equation:

$$G'_N = \begin{pmatrix} b_{1,1}T_{N_a} & \cdots & b_{1,N_b}T_{N_a} \\ \vdots & \ddots & \vdots \\ b_{j,1}T'_{N_a} & \cdots & b_{j,N_b}T'_{N_a} \\ \vdots & \ddots & \vdots \\ b_{N_b,1}T_{N_a} & \cdots & b_{N_b,N_b}T_{N_a} \end{pmatrix},$$

for any $1 \leq j \leq N_b$, wherein $T'_{N_a} = T_{N_a} \cdot \Pi_{N_a}^T$ and $\Pi_{N_a}^T$ is a permutation matrix defined by a predetermined permutation $\Pi_{N_a}$.

In another possible implementation form of the device according to the first aspect, the processor is further configured to determine the predetermined permutation $\pi_{N_a}$ in such a way that the minimum distance of the multi-kernel polar code $x_N$ of length N and dimension K is larger than a predefined threshold.

Thus, an improved device is obtained, since the generated multi-kernel polar code has an improved minimum distance, in particular a desired minimum distance being larger than a predefined threshold.

In another possible implementation form of the device according to the first aspect, the polar code $x_N$ has a length N=24, and the first transformation matrix is given by $G_{24} = T_3 \otimes T_2^{\otimes 3} = T_3 \otimes T_8$, wherein $$T_2 = \begin{pmatrix} 1 & 0 \\ 1 & 1 \end{pmatrix} \text{ and } T_3 = \begin{pmatrix} 1 & 1 & 1 \\ 1 & 0 & 1 \\ 0 & 1 & 1 \end{pmatrix},$$

and the processor is configured to generate the second transformation matrix on the basis of the following equation:

$$G'_{24} = \begin{pmatrix} T'_8 & T'_8 & T'_8 \\ T_8 & 0 & T_8 \\ 0 & T_8 & T_8 \end{pmatrix}.$$

In another possible implementation form of the device according to the first aspect, the predetermined permutation $\pi_8$ is given by:

$$\pi_8 = (7,1,4,3,2,5,6,8).$$

In another possible implementation form of the device according to the first aspect, the polar code $x_N$ has a length N=48, and the first transformation matrix is given by the following equation:

$$G_{48} = T_3 \otimes T_2^{\otimes 4} = T_3 \otimes T_{16}, \text{ with } T_2 = \begin{pmatrix} 1 & 0 \\ 1 & 1 \end{pmatrix} \text{ and } T_3 \begin{pmatrix} 1 & 1 & 1 \\ 1 & 0 & 1 \\ 0 & 1 & 1 \end{pmatrix}.$$

In another possible implementation form of the device according to the first aspect, the predetermined permutation $\pi_{16}$ is given by:

$$\pi_{16} = (2,13,4,5,1,10,7,9,8,16,3,12,11,15,14,6).$$

In another possible implementation form of the device according to the first aspect, the processer is further configured to generate a Golay code on the basis of the polar code $x_N$, wherein the polar code $x_N$ has a length N=32 and the predetermined permutation $\pi_8$ is given by:

$$\pi_8 = (7,1,4,3,2,5,6,8).$$

wherein the first transformation matrix is given by the following equation:

$$G_{32} = T_2^{\otimes 5} = T_2^{\otimes 2} \otimes T_2^{\otimes 3}.$$

and wherein the second transformation matrix is given by:

$$G'_{32} = \begin{pmatrix} T_8 & 0 & 0 & 0 \\ T_8 & T_8 & 0 & 0 \\ T_8 & 0 & T_8 & 0 \\ T'_8 & T'_8 & T'_8 & T'_8 \end{pmatrix},$$

wherein $T_8 = T_2^{\otimes 3}$ with $$T_2 = \begin{pmatrix} 1 & 0 \\ 1 & 1 \end{pmatrix}$$

and wherein the processor is further configured to generate the Golay code on the basis of the polar code $x_N$ using the following set I of 12 information bit indices:

$$I = \{3,5,6,7,11,13,14,15,19,21,22,23\}.$$

and by puncturing the last 8 bits of the polar code $x_N$.

According to a second aspect, the disclosure relates to a communication apparatus comprising a channel encoder comprising a device for generating a multi-kernel polar code according to the first aspect as such or any one of the implementation forms thereof.

According to a third aspect, the disclosure relates to a communication apparatus comprising a channel decoder comprising a device for generating a multi-kernel polar code according to the first aspect as such or anyone of the implementation forms thereof.

In a possible implementation form of the device according to the third aspect, the communication apparatus comprises a processor configured to decode the multi-kernel polar code on the basis of a successive-cancellation (SC) algorithm or a successive-cancellation list (SCL) algorithm.

Making use of list decoding or similar decoding methods provides the advantage of improving the distance properties of the multi-kernel polar code $x_N$.

According to a fourth aspect, the disclosure relates to a method for generating a multi-kernel polar code $x_N$ of length N and dimension K on the basis of a first transformation matrix of size N×N defining a first multi-kernel polar code, the method comprising the steps of: generating a second transformation matrix $G'_N$ of size N×N by permuting the order of at least two columns of a sub-matrix of the first transformation matrix $G_N$, and generating the multi-kernel polar code $x_N$ on the basis of the following equation:

$$x_N = u_N \cdot G'_N,$$

wherein $u_N = (u_0, \ldots, u_{N-1})$ is a vector of size N, with the elements $u_i$, $i=0, \ldots N-1$, corresponding to an information bit if $i \in I$, I being a set of K information bit indices, and $u_i = 0$, if $i \in F$, F being a set of N−K frozen bit indices.

According to a fifth aspect, the disclosure relates to a computer program comprising a program code for performing the method of the fourth aspect when executed on a computer.

The disclosure can be implemented in hardware and/or software.

BRIEF DESCRIPTION OF THE DRAWINGS

Further embodiments of the disclosure will be described with respect to the following figures.

In the various figures, identical reference signs will be used for identical or at least functionally equivalent features.

DETAILED DESCRIPTION OF EMBODIMENTS

In the following description, reference is made to the accompanying drawings, which form part of the disclosure, and in which are shown, by way of illustration, specific aspects in which the disclosure may be placed. It is understood that other aspects may be utilized and structural or logical changes may be made without departing from the scope of the disclosure. The following detailed description, therefore, is not to be taken in a limiting sense, as the scope of the disclosure is defined by the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
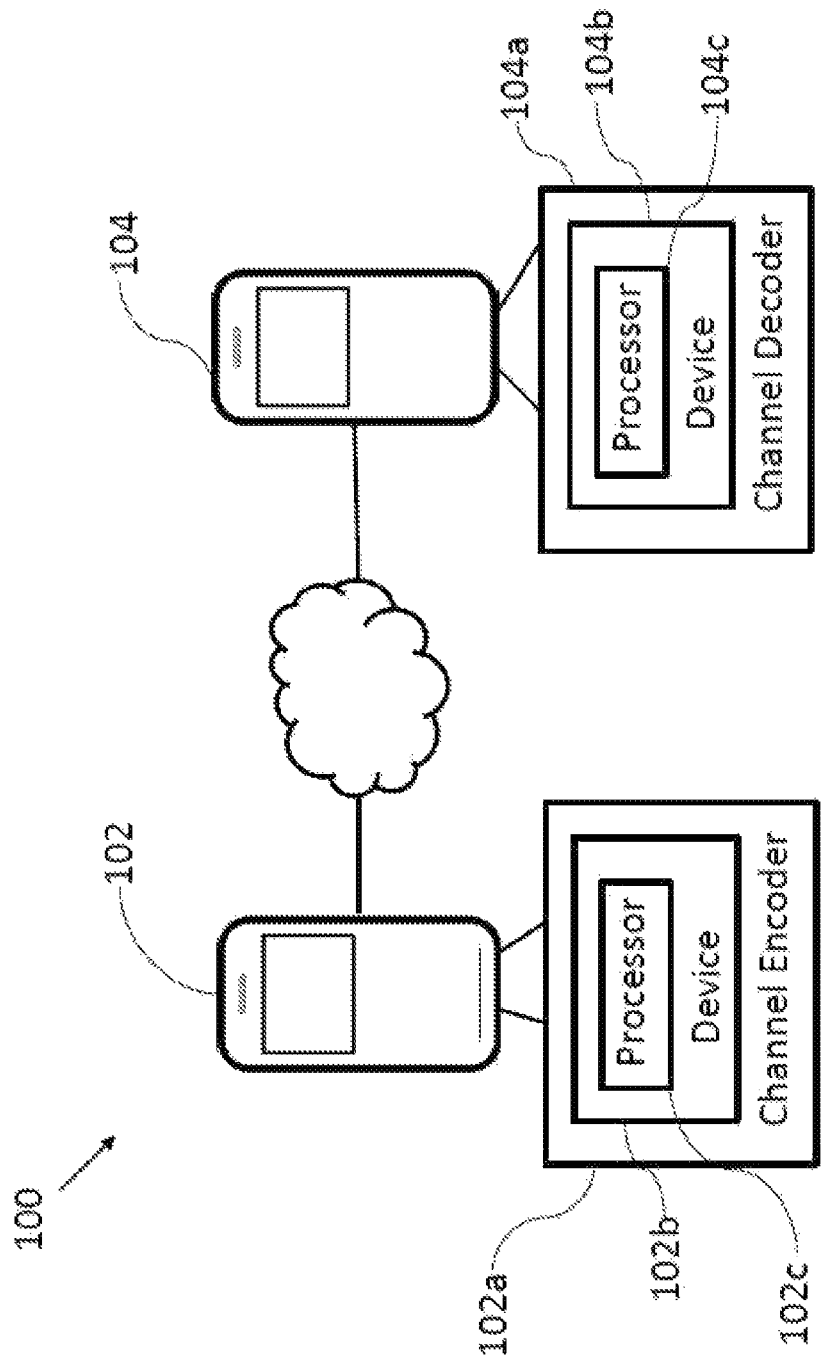
FIG. 1 shows a schematic diagram of a communication system with a communication apparatus comprising a device for generating a multi-kernel polar code according to an embodiment.

FIG. 1 shows a schematic diagram of a communication system 100 with a communication apparatus 102 comprising a device 102b for generating a multi-kernel polar code $x_N$ according to an embodiment.

The communication apparatus 102 comprises a channel encoder 102a, wherein the channel encoder 102a comprises the device 102b for generating the multi-kernel polar code $x_N$ of length N and dimension K on the basis of a first transformation matrix $G_N$ of size N×N defining a first multi-kernel polar code.

The device 102b comprises a processor 102c configured to generate a second transformation matrix $C'_N$ of size N×N by permuting the order of at least two columns of a sub-matrix of the first transformation matrix $G_N$, and generate the multi-kernel polar code $x_N$ on the basis of the following equation:

$$x_N = u_N \cdot G'_N,$$

wherein $u_N=(u_0, \ldots, u_{N-1})$ is a vector of size N, with the elements $u_i$, $i=0, \ldots N-1$, corresponding to an information bit if $i \in I$, I being a set of K information bit indices, and $u_i=0$, if $i \in F$, F being a set of N−K frozen bit indices.

Once, the multi-kernel polar code $x_N$ is generated, the communication apparatus 102 can be configured to send it to the communication apparatus 104 via a communication channel.

In an embodiment, the communication apparatus 104 comprises a channel decoder 104a, wherein the channel decoder 104a comprises a device 104b for generating a multi-kernel polar code as described above. Moreover, the device 104b can comprise a processor 104c configured to decode the multi-kernel polar code on the basis of a successive-cancellation (SC) algorithm or a successive-cancellation list (SCL) algorithm.

Thus, an improved device 102b is provided, since the generated multi-kernel polar code $x_N$ can be decoded, e.g., by the communication apparatus 104, according to the usual SC decoding (or SC list decoding) operations. Moreover, the processor 102c can be configured to permute the order of at least two columns of a sub-matrix of the first transformation matrix $G_N$, e.g., by means of the inner edge permutation or predetermined permutation, in a way such that the polarization phenomenon is not affected (i.e. destroyed), and thus reliabilities of the input bits are not changed. Correspondingly, the bit decoding order is not altered, and the decoding complexity at the communication apparatus 104 is not increased. Moreover, making use of list decoding or similar decoding methods improves the distance properties of the multi-kernel polar code. Furthermore, the device 102b allows to generate a multi-kernel polar code $x_N$ leading to lower error rates and reducing the cyclic redundancy check (CRC) size in SC list decoding.

Figure 2:
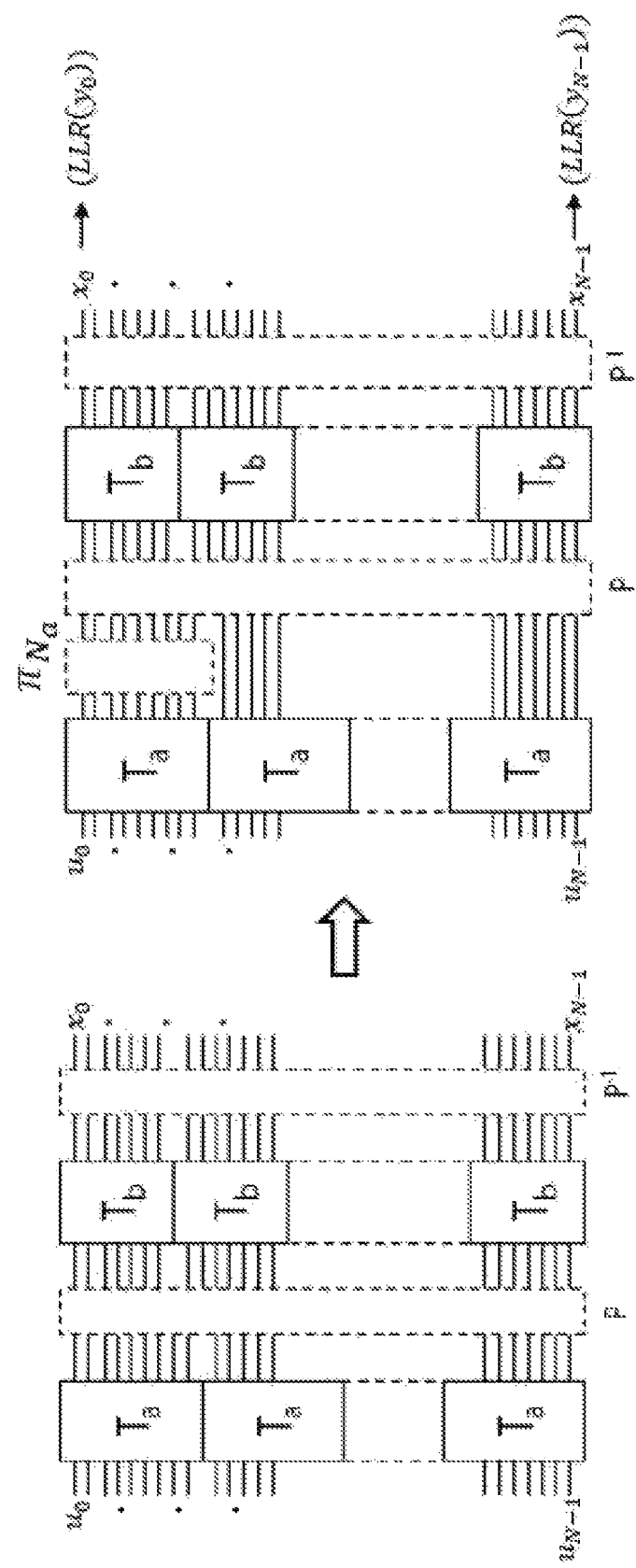
FIG. 2 shows a schematic diagram illustrating a Tanner graph of a multi-kernel polar code generated by a device according to an embodiment.

FIG. 2 shows a schematic diagram illustrating a Tanner graph of the multi-kernel polar code $x_N$ generated by the device 102b according to an embodiment.

In an embodiment, the processor 102c is configured to generate the first transformation matrix $G_N$ on the basis of the following equation:

$$G_N = T_{N_b} \otimes T_{N_a} = \begin{pmatrix} b_{1,1} T_{N_a} & \cdots & b_{1,N_b} T_{N_a} \\ \vdots & \ddots & \vdots \\ b_{N_b,1} T_{N_a} & \cdots & b_{N_b,N_b} T_{N_a} \end{pmatrix},$$

-continued
$$T_{N_b} = \begin{pmatrix} b_{1,1} & \cdots & b_{1,N_b} \\ \vdots & \ddots & \vdots \\ b_{N_b,1} & \cdots & b_{N_b,N_b} \end{pmatrix},$$

wherein $T_{N_b} = T_{p_1} \otimes \ldots \otimes T_{p_\lambda}$ is a first kernel matrix of dimension $N_b \times N_b$, $N_b = p_1 \cdot \ldots \cdot p_\lambda$, and $T_{N_a} = T_{p_{\lambda+1}} \otimes \ldots \otimes T_{p_s}$ is a second kernel matrix of dimension $N_a \times N_a$, $N_a = p_{\lambda+1} \cdot \ldots \cdot p_s$, and wherein $T_{p_j}$ is a kernel matrix of dimension $p_j \times p_j$, and wherein λ is an integer assuming a value in the interval [0, . . . , s], s being the total number of kernel matrices $T_{p_j}$ forming the first kernel matrix $T_{N_b}$ and the second kernel matrix $T_{N_a}$.

In particular, the processor 102c can be configured to permute the order of at least two columns of a sub-matrix of the first transformation matrix $G_N$ such that the second transformation matrix $G'_N$ has the same polarization as the first transformation matrix $G_N$. Moreover, the processor 102c can be configured to generate the second transformation matrix $G'_N$ of size N×N by permuting the order of the least two columns of the sub-matrix of the first transformation matrix $G_N$ and by permuting the order of at least two columns of a further sub-matrix of the first transformation matrix $G_N$.

In order to better elucidate how the processor 102c can permute the order of the columns of a sub-matrix of the first transformation matrix $G_N$ as explained above, reference can be made to the Tanner graph shown in FIG. 2. In general, the Tanner graph has a number of stages or layers equal to an integer S, wherein S is the number of factors of the Kronecker product, and represents the relationship between the input vector $u_N$ and the generated multi-kernel polar code $x_N$.

In the embodiment shown on the right of FIG. 2, the Tanner graph has S=2 stages: the first stage composed by $N_b$ kernels $T_b$ and the second stage composed by $N_a$ kernels $T_a$ (the stages are counted from right to left). On the left side of FIG. 2, a representation of a conventional Tanner graph is shown for comparison as well, wherein the two stages are connected by an edge permutation P, and the first stage is connected to the multi-kernel polar code $x_N$ by the edge permutation $P^{-1}$. On the right of FIG. 2, in the Tanner graph corresponding to the embodiment of the disclosure, a further predetermined permutation $\pi_{N_a}$ is added between the canonical edge permutation P and one of the kernels $T_a$. This embodiment has the advantage that the predetermined permutation $\pi_{N_a}$ does not alter the bit reliabilities or the SC decoding, since the input log-likelihood-ratios (LLRs) of a kernel are equally distributed.

The predetermined permutation $\pi_{N_a}$ can produce an effect on the second transformation matrix $G'_N$ of the multi-kernel polar code, since it shuffles the columns of a part of the first transformation matrix $G_N$. The processor 102c can be configured to apply the predetermined permutation $\pi_{N_a}$ to the first kernel $T_a$ as in the FIG. 2, and can further be configured to generate the second transformation matrix $G'_N$ on the basis of the following equation:

$$G'_N = \begin{pmatrix} b_{1,1} T_{N_a} & \cdots & b_{1,N_b} T_{N_a} \\ \vdots & \ddots & \vdots \\ b_{j,1} T'_{N_a} & \cdots & b_{j,N_b} T'_{N_a} \\ \vdots & \ddots & \vdots \\ b_{N_b,1} T_{N_a} & \cdots & b_{N_b,N_b} T_{N_a} \end{pmatrix},$$

for any $1 \leq j \leq N_b$, wherein $T'_{N_a} = T_{N_a} \cdot \Pi_{N_a}^T$ and $\Pi_{N_a}^T$ is a permutation matrix defined by the predetermined permutation $\pi_{N_a}$.

In an embodiment of the disclosure, besides the predetermined permutation $\pi_{N_a}$ as, e.g. shown in FIG. 2, further such edge permutations may be added to the Tanner graph, in order to improve the performance of the multi-kernel polar code $x_N$. Moreover, the processor 102c can be further configured to determine the predetermined permutation $\pi_{N_a}$ in such a way that the minimum distance of the multi-kernel polar code $x_N$ of length N and dimension K is larger than a predefined threshold.

The predetermined permutation $\pi_{N_a}$ and the corresponding permutation matrix $\Pi_{N_a}^T$ can be defined as follows. In an embodiment, the predetermined permutation $\pi_{N_a}$ of length $N_a$ is a bijection $\pi_{N_a}: [N_a] \to [N_a]$. Then, for the predetermined permutation $\pi_{N_a}$, the permutation matrix $\Pi_{N_a}^T$ corresponding to the predetermined permutation $\pi_{N_a}$ can be defined by:

$$(\Pi_{N_a}^T)_{r,m} \equiv \begin{cases} 1, & \text{if } m = \pi_{N_a} \\ 0, & \text{otherwise.} \end{cases}$$

The predetermined permutation $\pi_{N_a}$ alters the distance spectrum of the code and, thus, improves the error-rate performance. In particular, in an embodiment, this alteration increases the minimum distance of the multi-kernel polar code $x_N$. In another embodiment, this alteration only decreases the multiplicity of the multi-kernel polar codewords at the minimum distance.

Once, the multi-kernel polar code $x_N$ is generated, the communication apparatus 102 can be configured to send it to the communication apparatus 104 via the communication channel.

As already mentioned in the context of FIG. 1, the processor 104c of the communication apparatus 104 can be configured to decode the received symbols $y_0, \ldots, y_{N-1}$, namely the symbols $x_0, \ldots, x_{N-1}$ affected by the propagation through the communication channel, using a successive cancellation (SC) algorithm (see the aforementioned work by E, Arikan). The algorithm is initialized with the channel log-likelihood-ratios (LLRs) of the code bits at the right side of the Tanner graph. Then, the algorithm propagates the messages along the edges the Tanner graph of the multi-kernel polar code, namely the LLR values from right to left, and hard-decisions (bits) from left to right. LLRs and hard-decisions are computed according to update functions which can, for example, be found in the aforementioned work by Arikan and in the aforementioned document PCT/EP2016/069593. Within this algorithm, the input bits (on the left side of the graph) are successively decoded from top to bottom. In an embodiment, the processor 104c of the communication apparatus 104 can be configured to decode the received symbols $y_0, \ldots, y_{N-1}$ means of SC list decoding (see, I. Tal et al., "List decoding of polar codes," in IEEE ISIT, July 2011) or similar methods.

Figure 3:
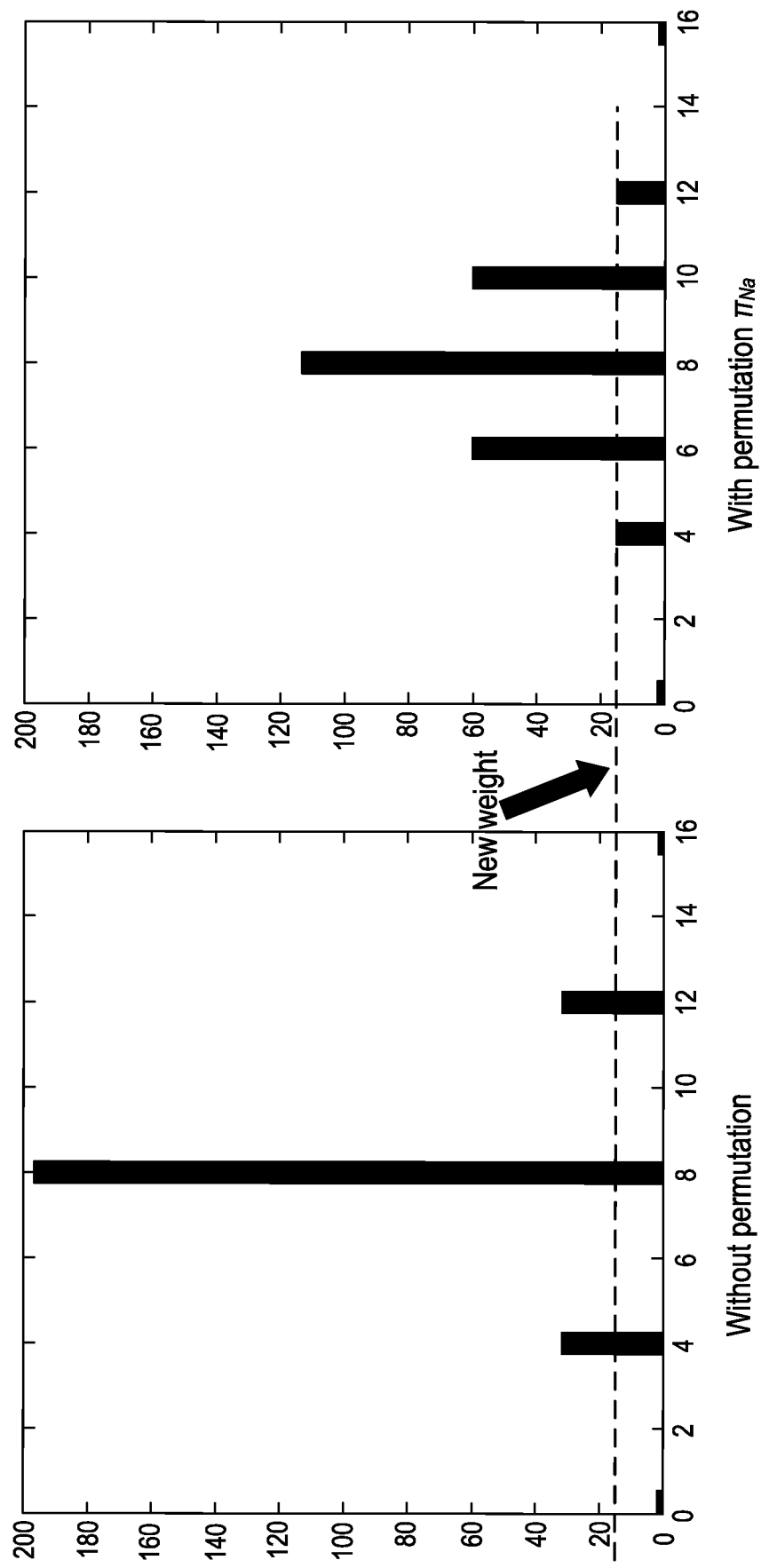
FIG. 3 shows a schematic diagram illustrating a distance spectrum of a multi-kernel polar code generated by a device according to an embodiment.

FIG. 3 shows a schematic diagram illustrating a distance spectrum of a multi-kernel polar code generated by the device 102b according to an embodiment.

In FIG. 3, the distance spectrum of a (16.8) multi-kernel polar code $x_{16}$ generated in order to maximize the minimum distance is shown. In particular, if the predetermined permutation $\pi_8 = (7,1,4,3,2,5,6,8)$ is applied to the upper half of the first transformation matrix $G_{16}$, the distance spectrum changes as shown in FIG. 3 on the right.

As can be seen in FIG. 3, embodiments of the disclosure (on the right of FIG. 3) reduce the number of minimum weight multi-kernel polar codewords. This property can be used, e.g., in order to reduce the CRC size necessary to decode the multi-kernel polar code $x_{16}$ with list decoding (see, the aforementioned work by I. Tal et al.). Moreover, in embodiments of the disclosure, the device 102b can even be configured to generate the multi-kernel polar code $x_{16}$ in such a way that the minimum distance of the multi-kernel polar code $x_{16}$ is reduced.

Figure 4:
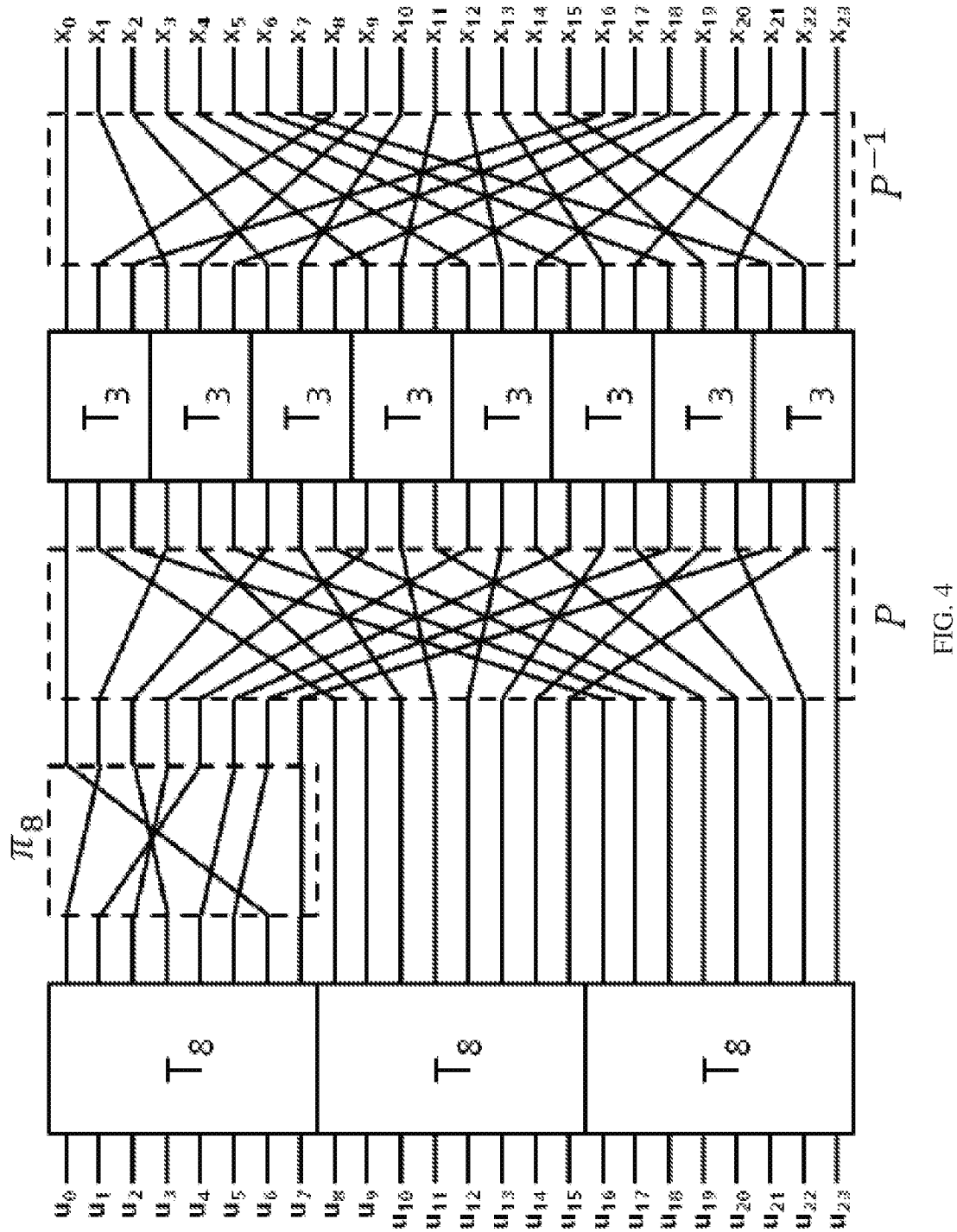
FIG. 4 shows a schematic diagram illustrating a Tanner graph of a multi-kernel polar code generated by a device according to an embodiment.

FIG. 4 shows a schematic diagram illustrating a Tanner graph of the multi-kernel polar code $x_{24}$ generated by the device 102b according to an embodiment.

In particular, in FIG. 4, an example of a Tanner graph of a (24,12) multi-kernel polar code $x_{24}$ is shown.

In general, using the following kernel matrices:

$$T_2 = \begin{pmatrix} 1 & 0 \\ 1 & 1 \end{pmatrix} \text{ and } T_3 = \begin{pmatrix} 1 & 1 & 1 \\ 1 & 0 & 1 \\ 0 & 1 & 1 \end{pmatrix},$$

according to PCT/EP2016/082555, it is possible to design a (24,12,6) multi-kernel polar code, wherein 6 is the maximal minimum distance achievable by such a multi-kernel polar code. However, it is known that the bound on the minimum distance for a (24,12) code is 8, and this bound is achieved by the (24,12,8) extended so-called Golay code.

In the following, it will be shown, how the processor 102c according to an embodiment can be configured in order to transform a (24,12,6) multi-kernel polar code into a (24,12,8) extended Golay code, which optimizes the minimum distance for a given code length and dimension.

Given a multi-kernel polar code $x_{24}$ defined by the transformation matrix $G_{24} = T_3 \otimes T_2^{\otimes 3} = T_3 \otimes T_8$, the processor 102c can be configured to add the predetermined permutation $\pi_8 = (7,1,4,3,2,5,6,8)$ before the first $T_8$ kernel. It is worth noticing that this permutation is not unique in order to obtain the desired result, since in other embodiments, 10,752 permutations out of all the 40,320 possible permutations of 8 elements can be used. However, in the embodiment wherein the predetermined permutation is given by $\pi_8 = (7,1,4,3,2,5,6,8)$, the processor 102c is configured to generate the second transformation matrix on the basis of the following equation:

$$G'_{24} = \begin{pmatrix} T'_8 & T'_8 & T'_8 \\ T_8 & 0 & T_8 \\ 0 & T_8 & T_8 \end{pmatrix},$$

whose Tanner graph is show n in FIG. 4.

Given the second transformation matrix $G'_{24}$, the processor 102c can be configured to obtain the (24,12,8) extended Golay code by taking as information set I={3,5,6,7,11,13,14,15,19.21.22,23}. As a result, the generator matrix of the Golay code is given by the following matrix:

$$\begin{pmatrix} 0 & 1 & 1 & 1 & 1 & 0 & 0 & 0 & 0 & 1 & 1 & 1 & 1 & 0 & 0 & 0 & 0 & 1 & 1 & 1 & 1 & 0 & 0 & 0 \\ 0 & 1 & 0 & 0 & 1 & 1 & 1 & 0 & 0 & 1 & 0 & 0 & 1 & 1 & 1 & 0 & 0 & 1 & 0 & 0 & 1 & 1 & 1 & 0 \\ 1 & 1 & 0 & 1 & 0 & 1 & 0 & 0 & 1 & 1 & 0 & 1 & 0 & 1 & 0 & 0 & 1 & 1 & 0 & 1 & 0 & 1 & 0 & 0 \\ 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 \\ 1 & 1 & 1 & 1 & 0 & 0 & 0 & 0 & 0 & 0 & 0 & 0 & 0 & 0 & 0 & 0 & 1 & 1 & 1 & 1 & 0 & 0 & 0 & 0 \\ 1 & 1 & 0 & 0 & 1 & 1 & 0 & 0 & 0 & 0 & 0 & 0 & 0 & 0 & 0 & 0 & 1 & 1 & 0 & 0 & 1 & 1 & 0 & 0 \\ 1 & 0 & 1 & 0 & 1 & 0 & 1 & 0 & 0 & 0 & 0 & 0 & 0 & 0 & 0 & 0 & 1 & 0 & 1 & 0 & 1 & 0 & 1 & 0 \\ 1 & 1 & 1 & 1 & 1 & 1 & 1 & 1 & 0 & 0 & 0 & 0 & 0 & 0 & 0 & 0 & 1 & 1 & 1 & 1 & 1 & 1 & 1 & 1 \\ 0 & 0 & 0 & 0 & 0 & 0 & 0 & 0 & 1 & 1 & 1 & 1 & 0 & 0 & 0 & 0 & 1 & 1 & 1 & 1 & 0 & 0 & 0 & 0 \\ 0 & 0 & 0 & 0 & 0 & 0 & 0 & 0 & 1 & 1 & 0 & 0 & 1 & 1 & 0 & 0 & 1 & 1 & 0 & 0 & 1 & 1 & 0 & 0 \\ 0 & 0 & 0 & 0 & 0 & 0 & 0 & 0 & 1 & 0 & 1 & 0 & 1 & 0 & 1 & 0 & 1 & 0 & 1 & 0 & 1 & 0 & 1 & 0 \\ 0 & 0 & 0 & 0 & 0 & 0 & 0 & 0 & 1 & 1 & 1 & 1 & 1 & 1 & 1 & 1 & 1 & 1 & 1 & 1 & 1 & 1 & 1 & 1 \end{pmatrix}.$$

Figure 5:
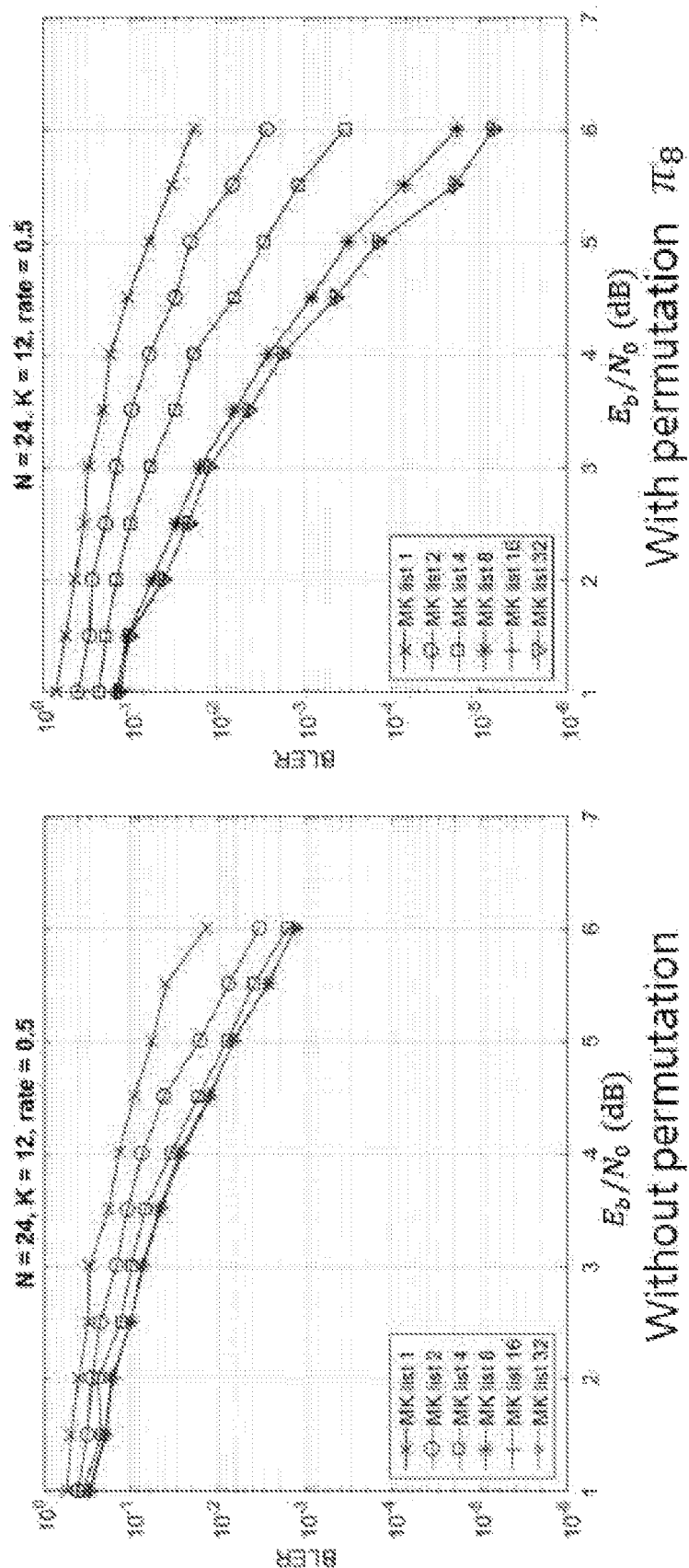
FIG. 5 shows a schematic diagram illustrating the performance of a multi-kernel polar code generated by a device according to an embodiment.

The block error rate performances (BLER) of the two codes, i.e. with and without the inner edge permutation or predetermined permutation $\pi_8$, under list decoding (see. I. Tal et al., "List decoding of polar codes," in IEEE ISIT, July 2011) are shown in FIG. 5 as a function of the signal-to-noise ratio $E_b/N_0$ in dB. As it can be taken from FIG. 5, the multi-kernel polar codes generated by the device 102b have a significantly improved performance (BLER) for list lengths of four and larger (compare left side and right side of the FIG. 5), and this happens without changing the decoding complexity. Therefore, the generation of multi-kernel polar codes $x_N$ according to embodiments of the disclosure (right side of FIG. 5) also allows for efficient decoding of the extended Golay code.

It is worth noticing that, in an embodiment, the (23,12,7) Golay code as well can be obtained from the proposed multi-kernel polar code construction by puncturing one bit, e.g., the last one $x_{23}$.

Figure 6:
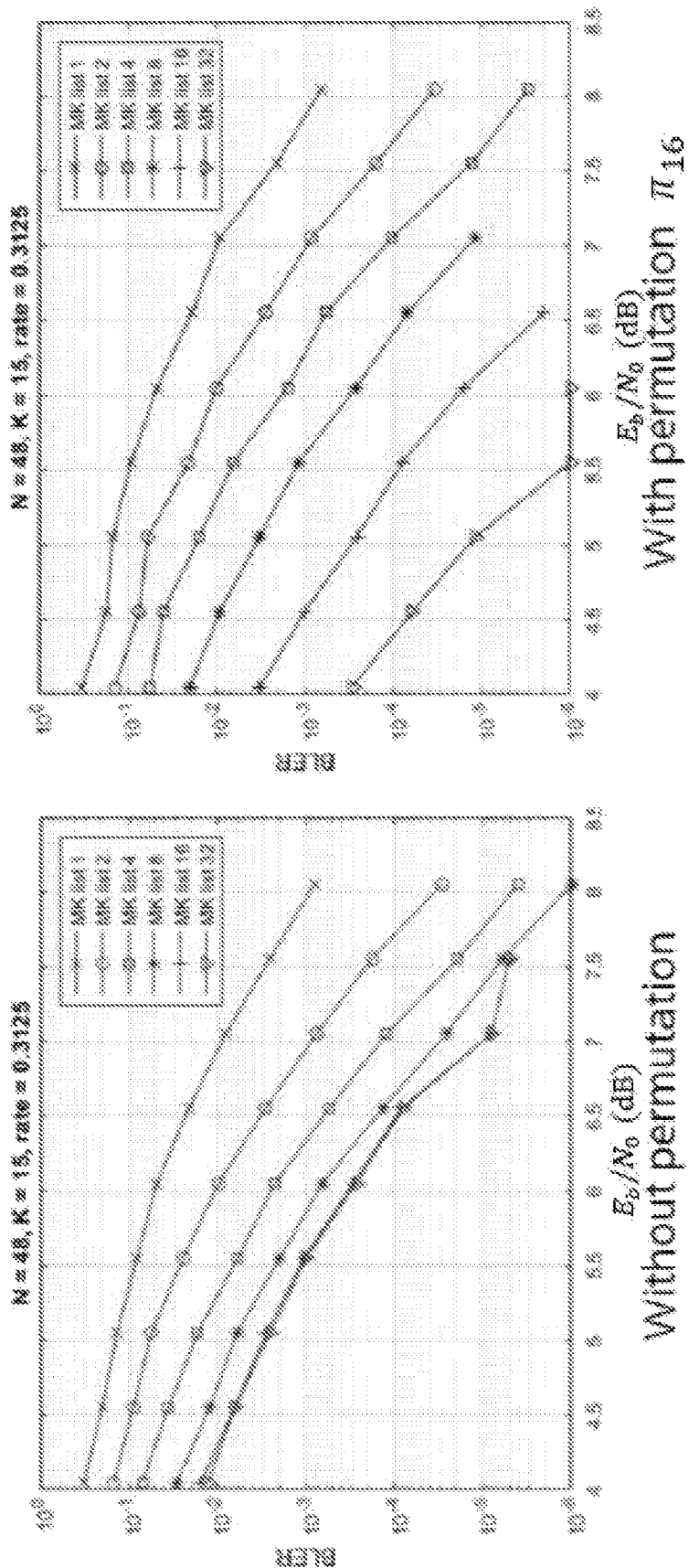
FIG. 6 shows a schematic diagram illustrating the performance of a multi-kernel polar code generated by a device according to an embodiment.

FIG. 6 shows a schematic diagram illustrating the performance of a multi-kernel polar code $x_{48}$ generated by the device 102b according to an embodiment.

In an embodiment, the processor 102c can be configured to generate the multi-kernel polar code $x_{48}$ on the basis of a first transformation matrix $G_{48}=T_3 \otimes T_2^{\otimes 4}=T_3 \otimes T_{16}$, which can be permuted using the following predetermined permutation:

$\pi_{16}=(2,13,4,5,1,10,7,9,8,16,3,12,11,15,14,6)$.

The predetermined permutation $\pi_{16}$ can be found offline for any code length.

In table 1, exemplary multi-kernel polar codes $x_{24}$ and $x_{48}$ are shown, which can be generated by the device 102b according to embodiments of the disclosure.

TABLE 1

Multi-kernel polar codes $x_{24}$ and $x_{48}$ without and with edge permutations or predetermined permutations $\pi_{N_a}$, and the increase in minimum distance.

| Without permutation | With permutation (new) |
|---|---|
| (24, 12, 6) | (24, 12, 8) ⇒ +2 |
| (48, 15, 12) | (48, 15, 16) ⇒ +4 |
| (48, 18, 8) | (48, 18, 10) ⇒ +2 |
| (96, 18, 24) | (96, 18, 32) ⇒ +8 |

In particular, in FIG. 6, the BLER of the two codes (48,15,16) and (48,15,12), i.e. with and without inner edge permutations or predetermined permutations $\pi_{16}$, as a function of the signal-to-noise ratio $E_b/N_0$ in dB are shown for list decoding (see, the aforementioned work by I. Tal et al.). Similarly to the shorter code, a significant decrease in the error rate can be observed for list length 8 or longer.

Figure 7:
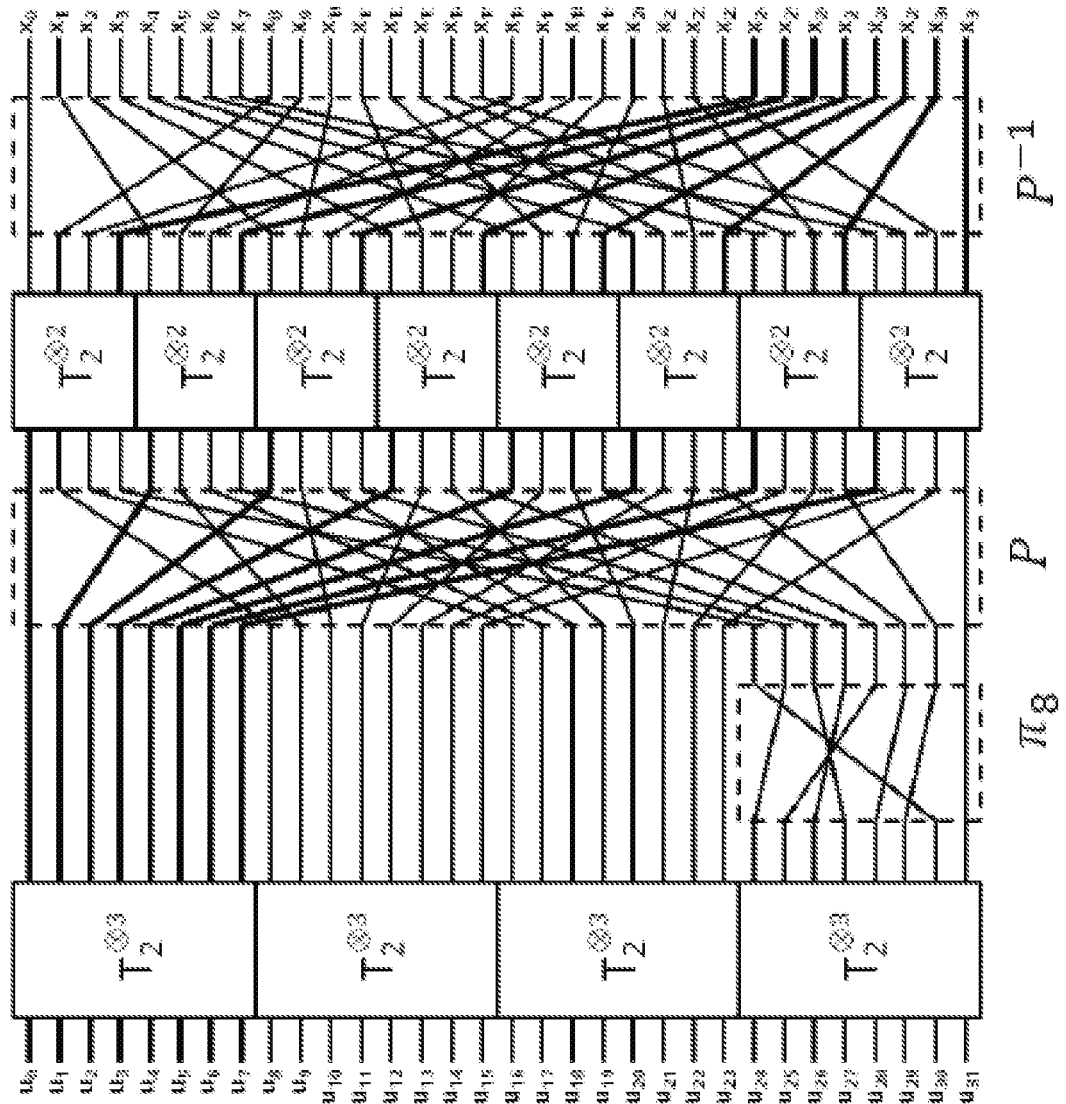
FIG. 7 shows a schematic diagram illustrating a Tanner graph of a polar code generated by a device according to an embodiment.

FIG. 7 shows a schematic diagram illustrating a Tanner graph of a polar code $x_{32}$ generated by the device 102b according to an embodiment. The processor 102c can be configured to improve the performance of polar codes, and also to increase the minimum distance of punctured or shortened polar codes.

In particular, in an embodiment, the processor 102c can be configured to obtain the (24,12,8) extended Golay code by puncturing a polar code $x_{32}$ of length 32 with an inner edge permutation or predetermined permutation $\pi_8$, as illustrated in the following. After generating the first transformation matrix $G_{32}=T_2^{\otimes 5}=T_2^{\otimes 2} \otimes T_2^{\otimes 3}$, the processor 102c can be configured to insert the predetermined permutation $\pi_8=(7, 1,4,3,2,5,6,8)$ before the last kernel $T_2^{\otimes 3}$, and to puncture the last 8 bits of the multi-kernel polar code $x_{32}$. As a result, the $T_2^{\otimes 2}$ kernels can be seen as kernels $$T_3 = \begin{pmatrix} 1 & 1 & 1 \\ 1 & 0 & 1 \\ 0 & 1 & 1 \end{pmatrix}.$$

In this embodiment, the second transformation matrix is given by the following equation:

$$G'_{32} = \begin{pmatrix} T_8 & 0 & 0 & 0 \\ T_8 & T_8 & 0 & 0 \\ T_8 & 0 & T_8 & 0 \\ T'_8 & T'_8 & T'_8 & T'_8 \end{pmatrix},$$

wherein $T_8=T_2^{\otimes 3}$ with $$T_2 = \begin{pmatrix} 1 & 0 \\ 1 & 1 \end{pmatrix}.$$

The resulting Tanner graph of the code is shown in FIG. 7, wherein the thick lines represent the channel LLRs set to zero due to the puncturing of the corresponding code bits.

Given the second transformation matrix $G'_{32}$, the processor 102c can be configured to generate the (24,12,8) Golay code by selecting the information set as I={11,13,14,15,19, 21,22,23,27,29,30,31}. As a result, the transformation matrix of the Golay code is given by:

$$\begin{pmatrix}
1 & 1 & 1 & 1 & 0 & 0 & 0 & 0 & 1 & 1 & 1 & 1 & 0 & 0 & 0 & 0 & 0 & 0 & 0 & 0 & 0 & 0 & 0 & 0 \\
1 & 1 & 0 & 0 & 1 & 1 & 0 & 0 & 1 & 1 & 0 & 0 & 1 & 1 & 0 & 0 & 0 & 0 & 0 & 0 & 0 & 0 & 0 & 0 \\
1 & 0 & 1 & 0 & 1 & 0 & 1 & 0 & 1 & 0 & 1 & 0 & 1 & 0 & 1 & 0 & 0 & 0 & 0 & 0 & 0 & 0 & 0 & 0 \\
1 & 1 & 1 & 1 & 1 & 1 & 1 & 1 & 1 & 1 & 1 & 1 & 1 & 1 & 1 & 1 & 0 & 0 & 0 & 0 & 0 & 0 & 0 & 0 \\
1 & 1 & 1 & 1 & 0 & 0 & 0 & 0 & 0 & 0 & 0 & 0 & 0 & 0 & 0 & 0 & 1 & 1 & 1 & 1 & 0 & 0 & 0 & 0 \\
1 & 1 & 0 & 0 & 1 & 1 & 0 & 0 & 0 & 0 & 0 & 0 & 0 & 0 & 0 & 0 & 1 & 1 & 0 & 0 & 1 & 1 & 0 & 0 \\
1 & 0 & 1 & 0 & 1 & 0 & 1 & 0 & 0 & 0 & 0 & 0 & 0 & 0 & 0 & 0 & 1 & 0 & 1 & 0 & 1 & 0 & 1 & 0 \\
1 & 1 & 1 & 1 & 1 & 1 & 1 & 1 & 0 & 0 & 0 & 0 & 0 & 0 & 0 & 0 & 1 & 1 & 1 & 1 & 1 & 1 & 1 & 1 \\
0 & 1 & 1 & 1 & 0 & 0 & 0 & 0 & 1 & 1 & 1 & 1 & 0 & 0 & 0 & 0 & 1 & 1 & 1 & 1 & 0 & 0 & 0 & 0 \\
0 & 1 & 0 & 0 & 1 & 1 & 1 & 0 & 0 & 1 & 0 & 0 & 1 & 1 & 1 & 0 & 0 & 1 & 0 & 0 & 1 & 1 & 1 & 0 \\
1 & 1 & 0 & 1 & 0 & 1 & 0 & 0 & 1 & 1 & 0 & 1 & 0 & 1 & 0 & 0 & 1 & 1 & 0 & 1 & 0 & 1 & 0 & 0 \\
1 & 1 & 1 & 1 & 1 & 1 & 1 & 1 & 1 & 1 & 1 & 1 & 1 & 1 & 1 & 1 & 1 & 1 & 1 & 1 & 1 & 1 & 1 & 1
\end{pmatrix}.$$

Figure 8:
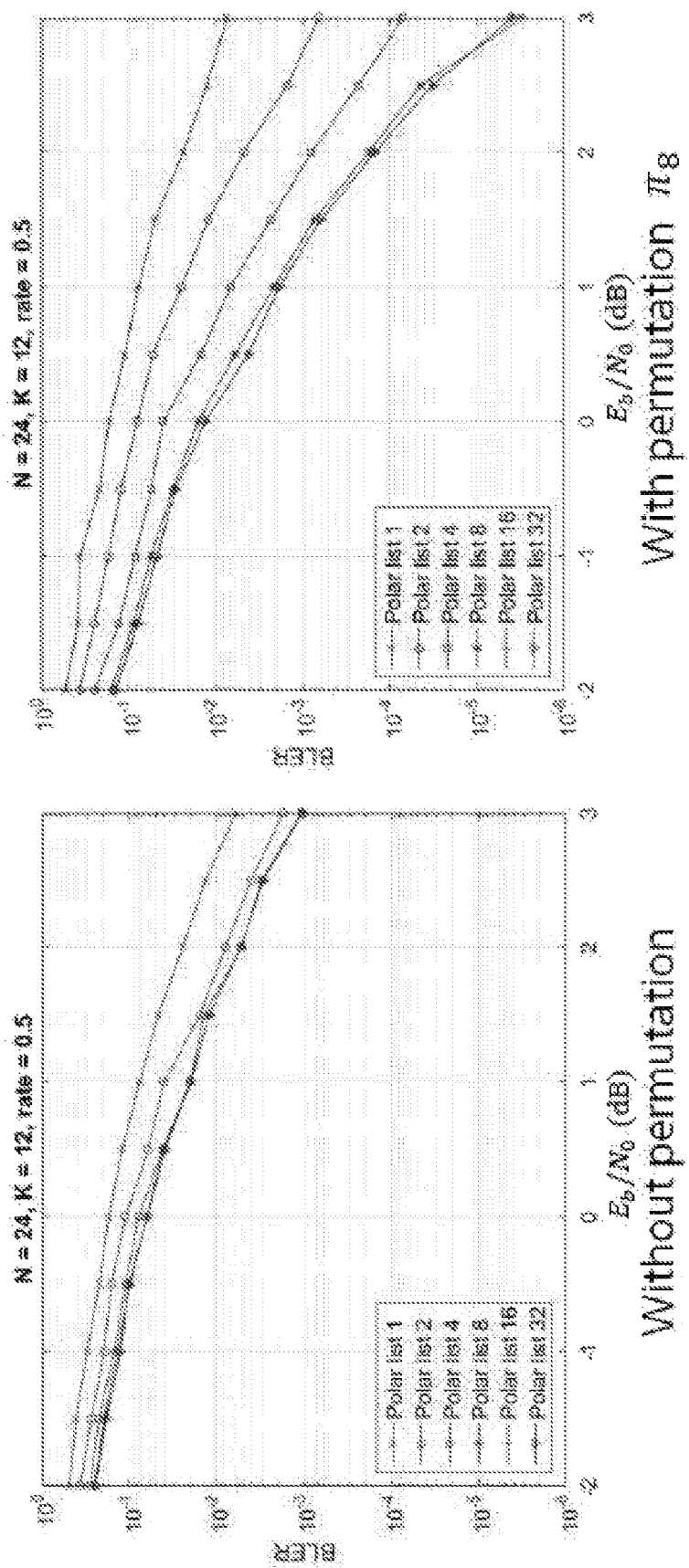
FIG. 8 shows a schematic diagram illustrating the performance of a polar code generated by a device according to an embodiment.

The BLER of the generated Golay code as a function of the signal-to-noise ratio $E_b/N_0$ in dB is depicted in FIG. 8. In this embodiment as well, for list size of 4 or larger, the additional inner edge predetermined permutation $\pi_8$ leads to a significantly improved performance.

Figure 9:
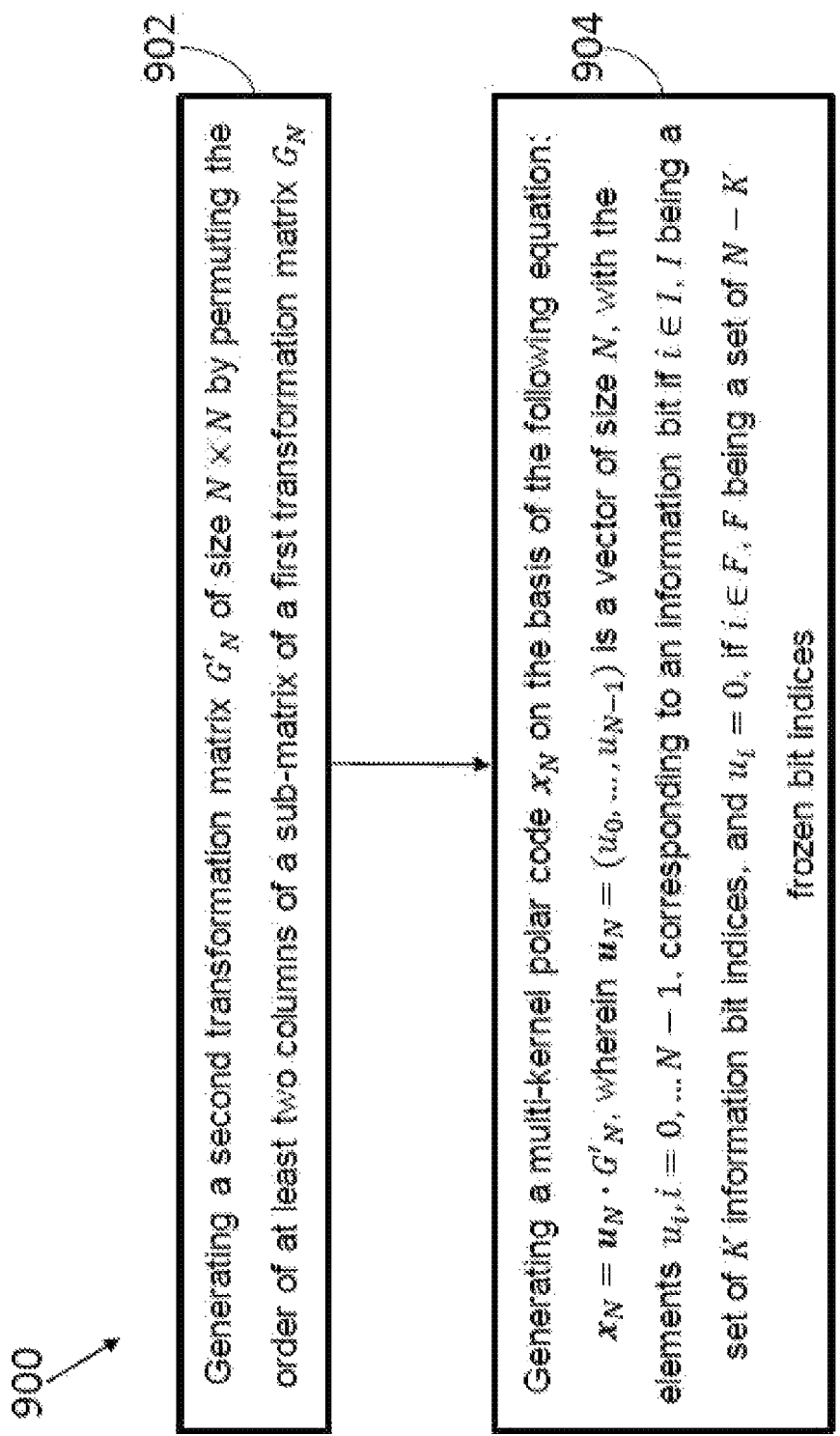
FIG. 9 shows a schematic diagram of a method for generating a multi-kernel polar code according to an embodiment.

FIG. 9 shows a schematic diagram of a corresponding method 900 for generating a multi-kernel polar code $x_N$ of length N and dimension K on the basis of a first transformation matrix $G_N$ of size N×N defining a first multi-kernel polar code according to an embodiment.

The method 900 comprises the steps of generating 902 a second transformation matrix $G'_N$ of size N×N by permuting the order of at least two columns of a sub-matrix of the first transformation matrix $G_N$, and generating 904 the multi-kernel polar code $x_N$ on the basis of the following equation:

$$x_N = u_N \cdot G'_N,$$

wherein $u_N = (u_0, \ldots, u_{N-1})$ is a vector of size N, with the elements $u_i$, i=0, . . . N−1, corresponding to an information bit if i∈I, I being a set of K information bit indices, and $u_i$=0, if i∈F, F being a set of N−K frozen bit indices.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the disclosure beyond those described herein. While the disclosure has been described with reference to one or more particular embodiments, those skilled in the art recognize that many changes may be made thereto without departing from the scope of the disclosure. It is therefore to be understood that within the scope of the appended claims and their equivalents, the disclosure may be practiced otherwise than as specifically described herein.

What is claimed is:

1. A device for generating a multi-kernel polar code $x_N$ of length N and dimension K, comprising:
   a memory configured to store instructions; and
   a processor coupled to the memory and configured to execute the instructions to:
      permute an order of at least two columns of a sub-matrix of a first transformation matrix $G_N$, wherein the first transformation matrix $G_N$ defines a multi-kernel polar code and comprises a size N×N;
      generate a second transformation matrix $G'_N$ of size N×N based on permuting the order of the at least two columns of the sub-matrix of the first transformation matrix $G_N$;
      generate the multi-kernel polar code $x_N$ on the basis of the following equation:

$$x_N = u_N \cdot G'_N,$$

wherein $u_N = (u_0, \ldots, u_{N-1})$ is a vector of size N with the elements $u_i$, i=0, . . . N−1 corresponding to an information bit when i∈I,
   wherein I is a set of K information bit indices,
   wherein $u_i$=0 when i∈F, and
   wherein F is a set of N−K frozen bit indices; and
   send the multi-kernel polar code $x_N$ to a second device over a transmission network to permit the second device to decode the multi-kernel polar code $x_N$.

2. The device of claim 1, wherein the processor is further configured to permute the order of the at least two columns of a sub-matrix of the first transformation matrix $G_N$ such that the second transformation matrix $G'_N$ has the same polarization as the first transformation matrix $G_N$.

3. The device of claim 1, wherein the processor is further configured to generate the second transformation matrix $G'_N$ by permuting the order of at least two columns of a further sub-matrix of the first transformation matrix $G_N$.

4. The device of claim 3, wherein the processor is further configured to determine a predetermined permutation $\pi_{N_a}$ such that the minimum distance of the multi-kernel polar code $x_N$ of length N and dimension K is larger than a predefined threshold.

5. The device of claim 4, wherein the processor is further configured to:

generate the first transformation matrix $G_N$ based on the following equation:

$$G_N = T_{N_b} \otimes T_{N_a} = \begin{pmatrix} b_{1,1} T_{N_a} & \cdots & b_{1,N_b} T_{N_a} \\ \vdots & \ddots & \vdots \\ b_{N_b,1} T_{N_a} & \cdots & b_{N_b,N_b} T_{N_a} \end{pmatrix},$$

$$T_{N_b} = \begin{pmatrix} b_{1,1} & \cdots & b_{1,N_b} \\ \vdots & \ddots & \vdots \\ b_{N_b,1} & \cdots & b_{N_b,N_b} \end{pmatrix},$$

wherein $T_{N_b} = T_{p_1} \otimes \ldots \otimes T_{p_\lambda}$ and is a first kernel matrix of dimension $N_b \times N_b$, wherein $N_b = p_1 \cdot \ldots \cdot p_\lambda$, wherein $T_{N_a} = T_{p_{\lambda+1}} \otimes \ldots \otimes T_{p_s}$ and is a second kernel matrix of dimension $N_a \times N_a$, wherein $N_a = p_{\lambda+1} \cdot \ldots \cdot p_s$, wherein $T_{p_j}$ is a kernel matrix of dimension $p_j \times p_j$, wherein $\lambda$ is an integer assuming a value in the interval $[0, \ldots, s]$, and wherein s is a total number of kernel matrices $T_{p_j}$ forming the first kernel matrix $T_{N_b}$ and the second kernel matrix $T_{N_a}$; and generate the second transformation matrix $G'_N$ based on the following equation:

$$G'_N = \begin{pmatrix} b_{1,1} T_{N_a} & \cdots & b_{1,N_b} T_{N_a} \\ \vdots & \ddots & \vdots \\ b_{j,1} T'_{N_a} & \cdots & b_{j,N_b} T'_{N_a} \\ \vdots & \ddots & \vdots \\ b_{N_b,1} T_{N_a} & \cdots & b_{N_b,N_b} T_{N_a} \end{pmatrix}, \text{ for any } 1 \leq j \leq N_b,$$

wherein $T'_{N_a} = T_{N_a} \cdot \Pi_{N_a}^T$ and $\Pi_{N_a}^T$ is a permutation matrix defined by the predetermined permutation $\pi_{N_a}$.

6. The device of claim 5, wherein the polar code $x_N$ has a length N=48, wherein the first transformation matrix is given by the following equation:

$G_{48} = T_3 \otimes T_2^{\otimes 4} = T_3 \otimes T_{16}$, and wherein $$T_2 = \begin{pmatrix} 1 & 0 \\ 1 & 1 \end{pmatrix} \text{ and } T_3 = \begin{pmatrix} 1 & 1 & 1 \\ 1 & 0 & 1 \\ 0 & 1 & 1 \end{pmatrix}.$$

7. The device of claim 6, wherein the predetermined permutation $\pi_{N_a}$ is given by $\pi_{16}$=(2,13,4,5,1,10,7,9,8,16,3,12,11,15,14,6).

8. The device of claim 5, wherein the polar code $x_N$ has a length N=24, wherein the first transformation matrix is given by $G_{24} = T_3 \otimes T_2^{\otimes 3} = T_3 \otimes T_8$, wherein $$T_2 = \begin{pmatrix} 1 & 0 \\ 1 & 1 \end{pmatrix} \text{ and } T_3 = \begin{pmatrix} 1 & 1 & 1 \\ 1 & 0 & 1 \\ 0 & 1 & 1 \end{pmatrix},$$

and wherein the processor is further configured to generate the second transformation matrix $G'_N$ based on the following equation:

$$G'_{24} = \begin{pmatrix} T'_8 & T'_8 & T'_8 \\ T_8 & 0 & T_8 \\ 0 & T_8 & T_8 \end{pmatrix}.$$

9. The device of claim 8, wherein the predetermined permutation $\pi_{N_a}$ is given by $\pi_8$=(7,1,4,3,2,5,6,8).

10. The device of claim 4, wherein the processor is further configured to generate a Golay code based on the polar code $x_N$ and the multi-kernel polar code $x_N$, wherein the polar code $x_N$ has a length N=32 and the predetermined permutation $\pi_{N_a}$ is given by $\pi_8$=(7,1,4,3,2,5,6,8), wherein the first transformation matrix is given by $G_{32} = T_2^{\otimes 5} = T_2^{\otimes 2} \otimes T_2^{\otimes 3}$, and wherein the second transformation matrix is given by $$G'_{32} = \begin{pmatrix} T_8 & 0 & 0 & 0 \\ T_8 & T_8 & 0 & 0 \\ T_8 & 0 & T_8 & 0 \\ T'_8 & T'_8 & T'_8 & T'_8 \end{pmatrix},$$

wherein $T_8 = T_2^{\otimes 3}$ with $$T_2 = \begin{pmatrix} 1 & 0 \\ 1 & 1 \end{pmatrix},$$

and wherein the Golay code is generated based on the multi-kernel polar code $x_N$ using the following set I of 12 information bit indices I={3,5,6,7,11,13,14,15,19,21,22,23} and puncturing the last 8 bits of the polar code $x_N$.

11. A method for generating a multi-kernel polar code $x_N$ of length N and dimension K, comprising:

permuting an order of at least two columns of a sub-matrix of a first transformation matrix $G_N$, wherein the first transformation matrix $G_N$ defines a multi-kernel polar code and comprises a size N×N;

generating a second transformation matrix $G'_N$ of size N×N based on permuting the order of the at least two columns of the sub-matrix of the first transformation matrix $G_N$;

generating the multi-kernel polar code $x_N$ based on the following equation:

$x_N = u_N \cdot G'_N$, wherein $u_N = (u_0, \ldots, u_{N-1})$ is a vector of size N, with the elements $u_i$, i=0, ... N−1, corresponding to an information bit if i∈I, wherein I is a set of K information bit indices, and wherein $u_i$=0 when i∈F, and wherein F is a set of N−K frozen bit indices; and sending the multi-kernel polar code $x_N$ to a second device over a transmission network to permit the second device to decode the multi-kernel polar code $x_N$.

12. The method of claim 11, further comprising permuting the order of the at least two columns of a sub-matrix of the first transformation matrix $G_N$ such that the second transformation matrix $G'_N$ has the same polarization as the first transformation matrix $G_N$.

13. The method of claim 11, further comprising generating the second transformation matrix $G'_N$ by permuting the order of the at least two columns of a further sub-matrix of the first transformation matrix $G_N$.

14. The method of claim 13, further comprising determining a predetermined permutation $\pi_{N_a}$ such that the minimum distance of the multi-kernel polar code $x_N$ of length N and dimension K is larger than a predefined threshold.

15. The method of claim 14, further comprising:

generating the first transformation matrix $G_N$ based on the following equation:

$$G_N = T_{N_b} \otimes T_{N_a} = \begin{pmatrix} b_{1,1} T_{N_a} & \cdots & b_{1,N_b} T_{N_a} \\ \vdots & \ddots & \vdots \\ b_{N_b,1} T_{N_a} & \cdots & b_{N_b,N_b} T_{N_a} \end{pmatrix},$$

$$T_{N_b} = \begin{pmatrix} b_{1,1} & \cdots & b_{1,N_b} \\ \vdots & \ddots & \vdots \\ b_{N_b,1} & \cdots & b_{N_b,N_b} \end{pmatrix},$$

wherein $T_{N_b} = T_{p_1} \otimes \ldots \otimes T_{p_\lambda}$ and is a first kernel matrix of dimension $N_b \times N_b$, wherein $N_b = p_1 \cdot \ldots \cdot p_\lambda$, wherein $T_{N_a} = T_{p_{\lambda+1}} \otimes \ldots \otimes T_{p_s}$ and is a second kernel matrix of dimension $N_a \times N_a$, wherein $N_a = p_{\lambda+1} \cdot \ldots \cdot p_s$, wherein $T_{p_j}$ is a kernel matrix of dimension $p_j \times p_j$, wherein $\lambda$ is an integer assuming a value in the interval $[0, \ldots, s]$, and wherein s is a total number of kernel matrices $T_{p_j}$ forming the first kernel matrix $T_{N_b}$ and the second kernel matrix $T_{N_a}$; and generating the second transformation matrix $G'_N$ based on the following equation:

$$G'_N = \begin{pmatrix} b_{1,1} T_{N_a} & \cdots & b_{1,N_b} T_{N_a} \\ \vdots & \ddots & \vdots \\ b_{j,1} T'_{N_a} & \cdots & b_{j,N_b} T'_{N_a} \\ \vdots & \ddots & \vdots \\ b_{N_b,1} T_{N_a} & \cdots & b_{N_b,N_b} T_{N_a} \end{pmatrix},$$

for any $1 \leq j \leq N_b$, wherein $T'_{N_a} = T_{N_a} \cdot \Pi_{N_a}^T$ and $\Pi_{N_a}^T$ is a permutation matrix defined by the predetermined permutation $\pi_{N_a}$.

16. The method of claim 15, wherein the polar code $x_N$ has a length N=24, wherein the first transformation matrix is given by $G_{24} = T_3 \otimes T_2^{\otimes 3} = T_3 \otimes T_8$, wherein $$T_2 = \begin{pmatrix} 1 & 0 \\ 1 & 1 \end{pmatrix} \text{ and } T_3 = \begin{pmatrix} 1 & 1 & 1 \\ 1 & 0 & 1 \\ 0 & 1 & 1 \end{pmatrix},$$

and wherein the method further comprises generating the second transformation matrix based on $$G'_{24} = \begin{pmatrix} T'_8 & T'_8 & T'_8 \\ T_8 & 0 & T_8 \\ 0 & T_8 & T_8 \end{pmatrix}.$$

17. The method of claim 15, further comprising generating a Golay code based on the polar code $x_N$ and the multi-kernel polar code $x_N$, wherein the polar code $x_N$ has a length N=32 and a predetermined permutation $\pi_8$ is given by $\pi_8 = (7,1,4,3,2,5,6,8)$, wherein the first transformation matrix is given by $G_{32} = T_2^{\otimes 5} = T_2^{\otimes 2} \otimes T_2^{\otimes 3}$, and wherein the second transformation matrix is given by $$G'_{32} = \begin{pmatrix} T_8 & 0 & 0 & 0 \\ T_8 & T_8 & 0 & 0 \\ T_8 & 0 & T_8 & 0 \\ T'_8 & T'_8 & T'_8 & T'_8 \end{pmatrix},$$

wherein $T_8 = T_2^{\otimes 3}$ with $$T_2 = \begin{pmatrix} 1 & 0 \\ 1 & 1 \end{pmatrix},$$

and wherein the Golay code is generated based on of the multi-kernel polar code $x_N$ using the following set I of 12 information bit indices I={3,5,6,7,11,13,14,15,19,21,22,23} and puncturing the last 8 bits of the polar code $x_N$.

18. The method of claim 17, wherein the predetermined permutation $\pi_{N_a}$ is given by $\pi_8 = (7,1,4,3,2,5,6,8)$.

19. The method of claim 15, wherein the polar code $x_N$ has a length N=48, and wherein the first transformation matrix is given by the following equation:

$G_{48} = T_3 \otimes T_2^{\otimes 4} = T_3 \otimes T_{16}$, wherein $$T_2 = \begin{pmatrix} 1 & 0 \\ 1 & 1 \end{pmatrix} \text{ and } T_3 = \begin{pmatrix} 1 & 1 & 1 \\ 1 & 0 & 1 \\ 0 & 1 & 1 \end{pmatrix}.$$

20. The method of claim 19, wherein the predetermined permutation $\pi_{N_a}$ is given by $\pi_{16} = (2,13,4,5,1,10,7,9,8,16,3,12,11,15,14,6)$.

* * * * *

UNITED STATES PATENT AND TRADEMARK OFFICE
CERTIFICATE OF CORRECTION

PATENT NO. : 11,245,424 B2
APPLICATION NO. : 16/797214
DATED : February 8, 2022
INVENTOR(S) : Valerio Bioglio and Ingmar Land Page 1 of 1

It is certified that error appears in the above-identified patent and that said Letters Patent is hereby corrected as shown below:

On the Title Page

(57) Abstract, Line 8: "an the basis" should read "on the basis"

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*